(12) United States Patent
Vaufredaz et al.

(10) Patent No.: US 8,372,728 B2
(45) Date of Patent: Feb. 12, 2013

(54) PROCESS FOR FABRICATING A MULTILAYER STRUCTURE WITH TRIMMING USING THERMO-MECHANICAL EFFECTS

(75) Inventors: Alexandre Vaufredaz, La Murette (FR); Sebastien Molinari, Sassenage (FR)

(73) Assignee: Soitec, Bernin (FR)

( * ) Notice: Subject to any disclaimer, the term of this patent is extended or adjusted under 35 U.S.C. 154(b) by 69 days.

(21) Appl. No.: 13/037,655

(22) Filed: Mar. 1, 2011
(Under 37 CFR 1.47)

(65) Prior Publication Data
US 2011/0230005 A1  Sep. 22, 2011

(30) Foreign Application Priority Data
Mar. 2, 2010 (FR) ..................................... 10 51487

(51) Int. Cl.
*H01L 21/302* (2006.01)
(52) U.S. Cl. ................. 438/459; 438/455; 257/E21.214
(58) Field of Classification Search .................. 438/455, 438/459
See application file for complete search history.

(56) References Cited

U.S. PATENT DOCUMENTS

| | | | | |
|---|---|---|---|---|
| 6,664,169 B1 * | 12/2003 | Iwasaki et al. | ................ | 438/409 |
| 7,883,991 B1 * | 2/2011 | Wu et al. | ........................ | 438/459 |
| 2006/0055003 A1 | 3/2006 | Tomita et al. | ................ | 257/629 |
| 2006/0160328 A1 | 7/2006 | Daval | ............................. | 438/455 |
| 2007/0072393 A1 * | 3/2007 | Aspar et al. | .................... | 438/459 |
| 2009/0095399 A1 | 4/2009 | Zussy et al. | ...................... | 156/60 |
| 2011/0097874 A1 * | 4/2011 | Broekaart et al. | ............ | 438/459 |
| 2011/0151644 A1 * | 6/2011 | Vaufredaz | ...................... | 438/459 |
| 2011/0183495 A1 * | 7/2011 | Sousbie et al. | ................ | 438/459 |
| 2011/0230003 A1 * | 9/2011 | Vaufredaz et al. | .............. | 438/67 |
| 2011/0308739 A1 * | 12/2011 | McCutcheon et al. | ......... | 156/766 |
| 2012/0028439 A1 * | 2/2012 | Zhang et al. | ................... | 438/459 |

FOREIGN PATENT DOCUMENTS

| | | |
|---|---|---|
| EP | 0 854 500 A1 | 7/1998 |
| EP | 1 855 309 A1 | 11/2007 |
| EP | 1 887 613 A1 | 2/2008 |
| KR | 20070110261 | 11/2007 |
| WO | WO 2009/106330 A1 | 9/2009 |

* cited by examiner

*Primary Examiner* — Alexander Ghyka
(74) *Attorney, Agent, or Firm* — Winston & Strawn LLP

(57) ABSTRACT

The invention relates to a process for fabricating a multilayer structure that includes bonding a first wafer onto a second wafer, where the first wafer may have a chamfered edge and the bonding interface has an adhesion energy of less than or equal to 1 J/m², and thinning the first wafer so as to form a transferred layer, where before thinning the first wafer, a step of trimming the edge of the first wafer is carried out using a grinding wheel having a working surface which comprises grit particles with an average size of greater than or equal to 800 mesh or less than or equal to 18 microns, and wherein the trimming step is carried out by lowering the grinding wheel at a rate of descent of greater than or equal to 5 microns per second, such that the descent of the grinding wheel into the first wafer continues to a distance from the bonding interface that is less than or equal to 30 μm.

20 Claims, 4 Drawing Sheets

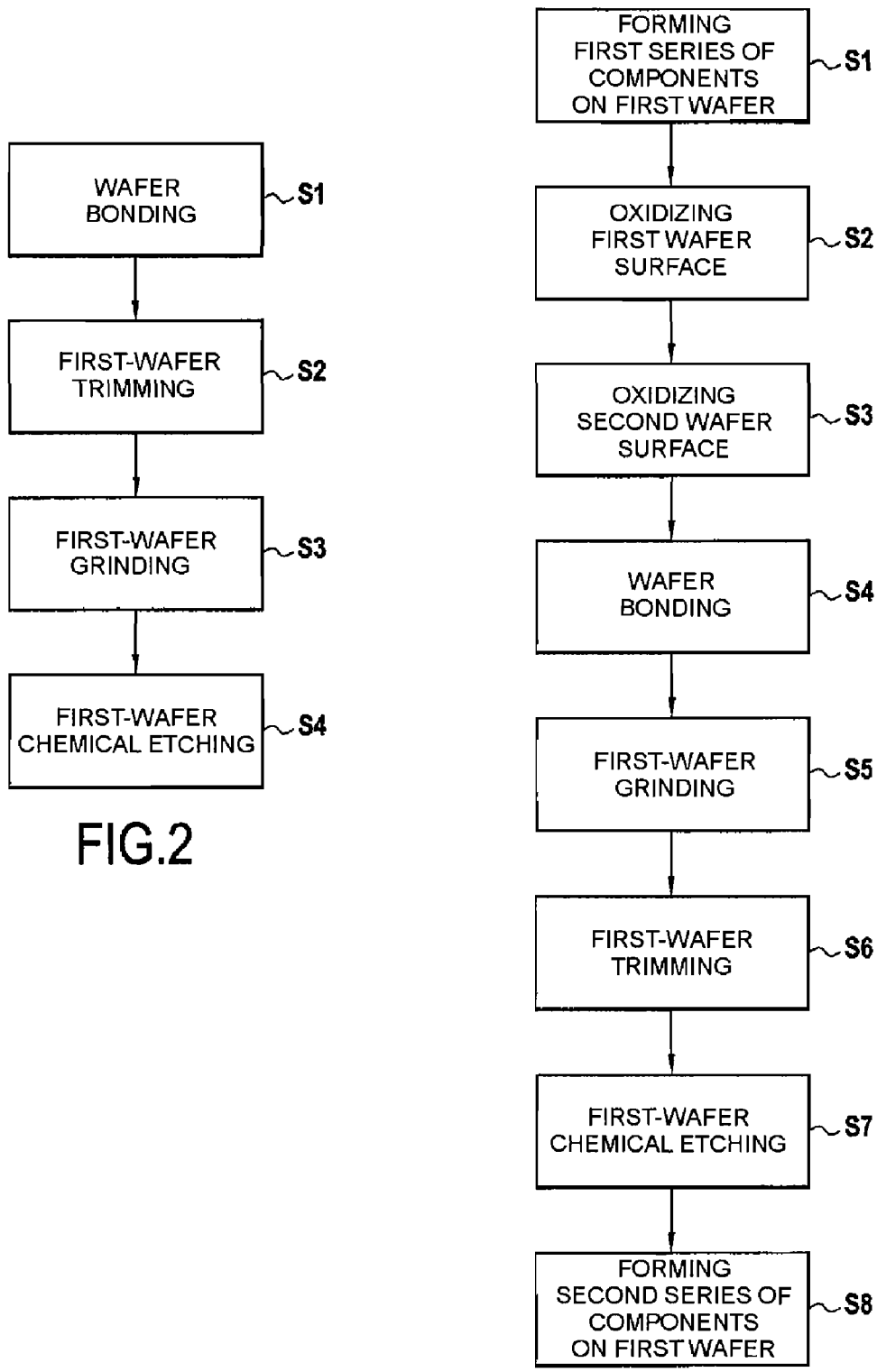

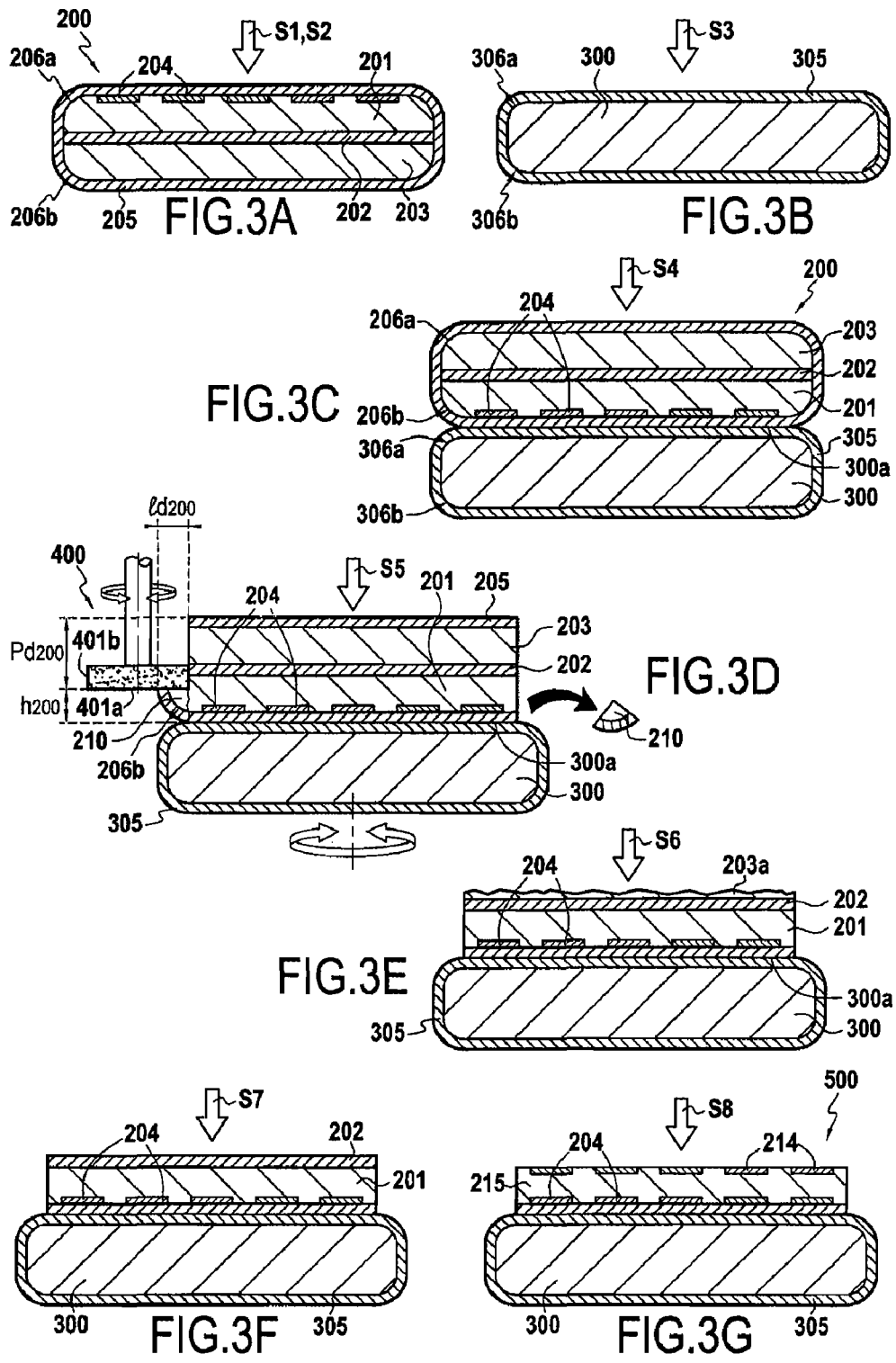

PROCESS FOR FABRICATING A MULTILAYER STRUCTURE WITH TRIMMING USING THERMO-MECHANICAL EFFECTS

FIELD OF THE INVENTION

The present invention relates to the field of fabricating multilayer semiconductor structures or substrates (also called multilayer semiconductor wafers) fabricated by transferring at least one layer onto a support.

BACKGROUND OF THE INVENTION

Fabrication of multilayer structures comprises, in general, direct wafer bonding or fusion bonding of a first wafer, for example a silicon or silicon-on-insulator (SOI) wafer, onto a second wafer or support, for example made of silicon or sapphire, a bond-strengthening anneal, and thinning of the first wafer so as to form a layer transferred onto the second wafer.

The invention more particularly concerns multilayer structures having a relatively weak bonding interface due to limiting the temperature of the bond-strengthening anneal. After direct wafer bonding, the structure is normally annealed so as to strengthen the bond between the two wafers, that is to say to increase the surface energy of the bond between them. The higher the temperature of the bond-strengthening anneal, the greater the resulting bond or adhesion energy.

There are several cases of multilayer structures in which the bond annealing temperature must be limited to relatively low values.

The first case concerns the fabrication of what are called "heterogeneous" multilayer structures, heterogeneous in that the two wafers to be bonded or assembled have different coefficients of thermal expansion, for example different by at least 10% or 20% at room temperature (20° C.). Heterostructures having such characteristics are especially silicon-on-sapphire ($Al_2O_3$) (SOS) structures used particularly in microelectronics or in optoelectronics. During increases in temperature, for example from 200° C. and above, the variations in behaviour of one of the two wafers relative to the other cause stresses and/or strains in the heterostructure that can lead to delamination or detachment of the wafers or layers if present, and/or plastic deformations and/or cracks and/or breakage of one of the substrates or layers if present. This is why, with such structures, the temperature of the bond-strengthening anneal is limited.

A second case concerns multilayer structures in which the first wafer furthermore comprises all or part of a component or a plurality of microcomponents, such as in the case of 3D-integration technology that requires one or more layers of microcomponents to be transferred onto a final support, but also in the case of circuit transfer, as for example in the fabrication of backlit imagers. In this case, the temperature of the bond-strengthening anneal must be limited so as not to damage the previously fabricated micro-components.

When forming these different structures, the edges of the wafers used especially to form the transferred layers and the supports generally are chamfered or have rounded edges. The purpose of this chamfering is to make handling easier and to prevent edge flaking that could occur if these edges were sharp, such flakes being sources of particulate contamination of the surfaces of wafers. The chamfers may have a rounded and/or bevelled form.

The presence of these chamfers, however, prevents good contact between the wafers at their periphery. This adhesion weakness is even more pronounced when the bonding interface is also weak due to the limitation in the temperature of the bond-strengthening anneal as described above. Consequently, there is a peripheral region in which the first wafer or transferred layer is weakly bonded, or not bonded at all. This peripheral region of the first wafer or transferred layer must then be removed because it is liable to break in an uncontrolled way and to contaminate the structure with undesirable fragments or particles.

Hence, once the wafer is bonded onto the support, and after the wafer has been thinned, the transferred layer is trimmed so as to remove the peripheral region over which the chamfers extend. The trimming is normally carried out by mechanically machining, especially by abrasion, the exposed surface of the transferred layer as far down as the supporting second wafer.

A deep mechanical trimming causes peel-off problems both at the bonding interface between the transferred layer and the support and in the transferred layer itself. More precisely, at the bonding interface the peel-off problems correspond to delamination of the transferred layer from the support in certain regions near the periphery of the layer, which may be termed "macro peel-off". The bond energy is weaker near the periphery of the layer due to the presence of the chamfers. Consequently, this trimming may lead, in this location, to a partial debonding of the layer at its bonding interface with the supporting substrate.

Consequently, there exists a problem of finding a process that allows the first wafer, or transferred layer, in a multilayer structure to be trimmed without the abovementioned drawbacks. The present invention now provides solution to this problem.

SUMMARY OF THE INVENTION

The present invention alleviates the aforementioned drawbacks by providing a process for fabricating a multilayer structure that reduces or eliminates the likelihood of such delamination or wafer breakage. To do this, the present invention relates to a process that comprises bonding a first wafer having a chamfered edge onto a second wafer at a bonding interface in a manner that provides the bonding interface with an adhesion energy of less than or equal to $1 \text{ J/m}^2$; trimming the edge of the first wafer using a grinding wheel, wherein the descent of the grinding wheel into the first wafer continues to a distance from the bonding interface that is less than or equal to 30 μm; and thinning the first wafer after trimming the edge, so as to form a transferred layer.

The process preferably comprises thinning the first wafer, wherein the first wafer has a thickness of at least 600 μm before thinning, so as to form a transferred layer, and in which, before the thinning of the first wafer, a step of trimming the edge of the first wafer is carried out using a grinding wheel, the working surface of which comprises grit particles having an average size of less than or equal to 18 microns or greater than or equal to 800 mesh, the trimming step being carried out by lowering the grinding wheel at a rate of descent of greater than or equal to 5 microns per second, the descent of the grinding wheel into the first wafer being furthermore stopped at a distance or height from the bonding interface of less than or equal to 30 μm. The thinning step applied to the first wafer comprises grinding, or may further comprise a chemical etch step carried out after the grinding step.

The edge of the first wafer is trimmed by a width that is at least equal to the width over which the chamfered edge extends. The width of material removed from the periphery of the first wafer by the trimming step is therefore preferably between 2 mm and 10 mm, more preferably between 2 mm and 8 mm, and most preferably between 2 mm and 6 mm.

The first wafer may be a silicon wafer or an SOI structure. The second wafer may be a silicon wafer or a sapphire wafer. The process may further comprise forming an oxide layer on at least the bonding surface or on all exposed surfaces of the first wafer before bonding the first wafer to the second wafer. An oxide layer may also be formed on the bonding surface or all exposed surfaces of the second wafer before bonding the first wafer to the second wafer.

The process may further comprise fabricating at least one layer of components on one side of the first wafer before the bonding step, and wherein the side of the first wafer having the layer of components is the side bonded onto the second wafer. The process may also further comprise a step of fabricating a second layer of microcomponents on the side of the first wafer opposite the side having the first layer of components. The first wafer may therefore comprise a layer of components on one side of the wafer, or two layers of components where each layer of components is on opposite sides of the first wafer. The components may be micro-electronic components or opto-electronic components, and are preferably image sensors or three-dimensional structures.

The use of the trimming process of the invention allows three-dimensional structures to be fabricated by stacking two or more wafers, while minimizing the risks of delamination both at the bonding interfaces between the wafers and in the layers of components. One of the layers of components may especially comprise image sensors.

BRIEF DESCRIPTION OF THE DRAWINGS

Other features and advantages of the invention will become clear from the following description of particular embodiments of the invention, given by way of non-limiting example, with reference to the appended drawings, in which:

FIG. 2 is a flowchart of the steps implemented during the process illustrated in FIGS. 1A to 1E;

FIGS. 3A to 3G are schematic views showing the fabrication of a three-dimensional structure implementing the trimming process of the present invention; and FIG. 4 is a flowchart of the steps implemented during the fabrication of the three-dimensional structure illustrated in FIGS. 3A to 3G.

DETAILED DESCRIPTION OF THE INVENTION

Figure 1A:
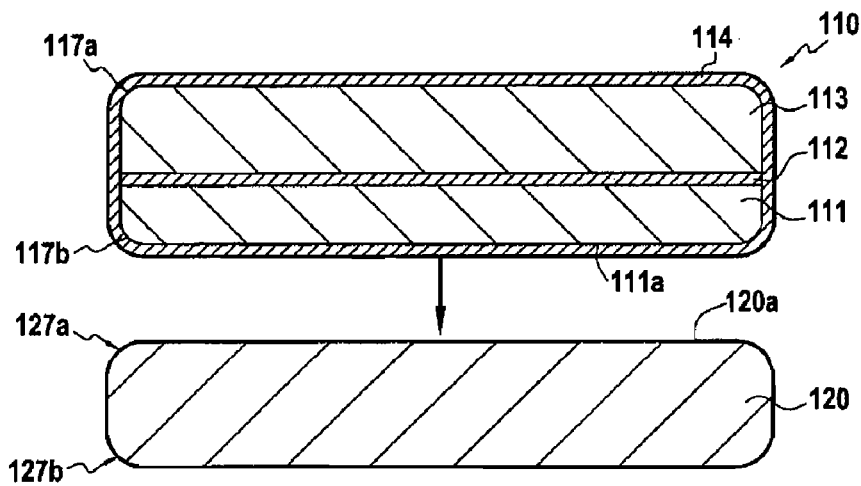
FIGS. 1A to 1E are schematic views of a process for fabricating a multilayer structure conforming to a embodiment of the invention.
Figure 1B:
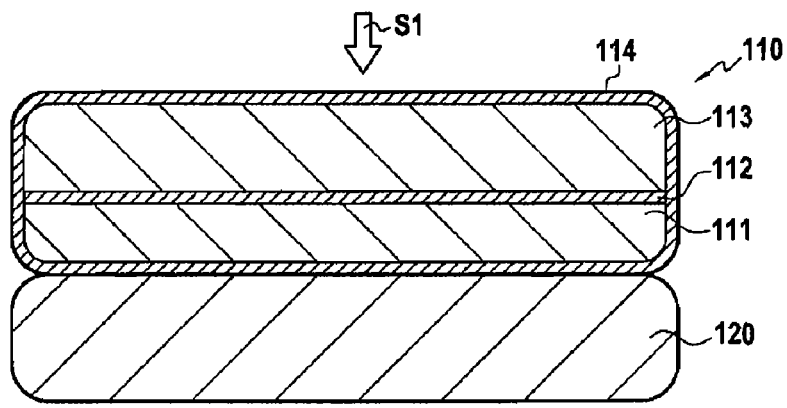

The present invention relates to a process for forming heterostructures by bonding two wafers at a bonding interface that avoids delamination and wafer cracking. The process generally involves the trimming of a multilayer structure comprising at least two wafers joined to each other by bonding and for which the surface energy of the bond is limited to 1 J/m² or less, and at least one of the two wafers have chamfers or rounded edges on its periphery. The process is especially applicable to such multilayer structures fabricated from at least two wafers having different coefficients of thermal expansion, or structures comprising micro-components, for which the temperature of the bond-strengthening anneal, which allows the bond to be stabilized and the bond energy to be increased, must be limited. The invention could be equally applied to multilayer structures in which the wafers are joined to each other by another type of bonding such as anodic bonding, metallic bonding, or adhesive bonding, provided the bond energy remains below 1 J/m².

The wafers used in the present invention are generally circular and may have various diameters, especially diameters of 100 mm, 150 mm, 200 mm or 300 mm. Such wafers may be monolithic silicon, and may be covered with an oxide layer, for example a thermal oxide layer having a thickness between 0.1 and 3 µm. The first wafer may also be a silicon-on-insulator substrate. The second wafer, also referred to as a support substrate, may be made of sapphire. The first wafer typically has a thickness of between 600 and 900 µm.

In some embodiments, components may have already been formed in one of the wafers which is then bonded onto the other wafer that acts as a support. The term "components" is understood here to mean any element fabricated with materials different from that of the wafer and which are sensitive to the high temperatures customarily used to strengthen the bonding interface. These components correspond especially to elements forming all or part of an electronic component or of a plurality of electronic microcomponents, such as circuits or contacts or even active layers.

The invention is more particularly, but not exclusively, applicable to silicon-on-sapphire (SOS) heterostructures formed by assembling a first silicon wafer or substrate comprising silicon such as an SOI structure and a second sapphire wafer or substrate. Heterostructures comprising a silicon layer on a sapphire substrate have particular advantages. Such SOS structures allow high-frequency, low-power-consumption devices to be fabricated. The use of sapphire substrates furthermore allows very good heat dissipation, better than that obtained for example using quartz substrates.

The process comprises direct bonding the first wafer or substrate to the second wafer or substrate at a bonding interface. As is well known in the art, the principle of direct wafer bonding, or just direct bonding, is based on direct contact between two surfaces—that is to say that no specific material (adhesive, wax, braze, etc.) is used. To carry out such an operation, it is necessary for the bonding surfaces to be sufficiently smooth, particle- and contamination-free, and for the bonding surfaces to be placed sufficiently close to each other so that a contact is initiated—typically a distance of less than a few nanometres is required. In this case, the attractive forces between the two surfaces are strong enough that direct bonding occurs, i.e., bonding induced by the Van der Waals forces between the atoms or molecules of the two surfaces to be bonded.

The bonding thus carried out is not stable until a bond-strengthening anneal has been carried out. It is possible to subject the assembly of the two wafers to an anneal, but the temperature of this anneal must necessarily be limited because of the difference in the coefficient of thermal expansion between the two wafers in the case of SOS for example.

In the example described here, the anneal cannot exceed 180° C. for a time of less than about ten hours. Such an anneal only allows stabilization of the bond to the extent that the surface energy of the bond does not exceed 700 mJ/m².

The present invention then comprises trimming the periphery of the first wafer, wherein the first wafer is trimmed to a depth that is less than the total thickness of the wafer. The edge of the first wafer is removed until less than 30 µm remains, or more preferably less than 20 µm remains, or most preferably less than 10 µm remains between the grinding tool and the bonding interface.

Trimming is carried out by mechanical action or machining (edge grinding) from the top side of the first wafer towards the bonding interface. The mechanical action may be applied by a grinding wheel (abrasion) or any other tool capable of mechanically wearing away the material of the layer.

Under certain conditions thermo-mechanical effects are created by the trimming process such that the remaining portion of the first wafer to be trimmed is lifted off, which is to say the portion of the first wafer, located above the bonding interface, into which the grinding wheel or tool has not yet penetrated is weakened to thereby facilitate lift-off. By stopping the descent of the tool before the latter reaches the bonding interface between the first and second wafers the peel-off and debonding problems described above are avoided.

More precisely, in the present invention, trimming is carried out with a grinding wheel the working surface or active part of which comprises grit particles having an average size of less than or equal to 18 microns or greater than or equal to 800 mesh. The grit particles may especially be diamond particles.

Furthermore, the rate of descent, also called the rate of advance, of the grinding wheel is greater than or equal to 5 µm/s.

The adjustment of these two parameters maximizes thermal and mechanical effects of trimming on the first wafer, in particular at the end of the trimming, weakening the ring, or portion of the first wafer remaining beneath the wheel, especially by creating cracks therein—consequently making its lift-off easier. These effects are all the more substantial in that, in the invention, the trimming is carried out before the thinning of the first wafer, hence a substantial amount of material is removed during the trimming, enabling substantial thermo-mechanical effects to be obtained at the end of the trimming.

In contrast to the prior art, where the grinding wheel was lowered at least as far as the bonding interface during the trimming of the first wafer, in the present invention the grinding wheel is stopped at a defined height above the bonding interface. More precisely, the penetration depth, also called "targeted depth", of the grinding wheel into the first wafer, is adjusted so as to stop the descent of the grinding wheel into the first wafer at a distance of less than 30 µm from the bonding interface, preferably at a distance of less than 20 µm. Generally, the descent of the grinding wheel is stopped at a height of between 30 µm and 10 µm from the bonding interface.

Maximization of thermo-mechanical effects during the trimming as explained above, and the weakness of the bonding interface between the two layers, enables complete trimming of the first wafer to be obtained by lift-off of the remaining portion to be trimmed even though the first wafer is not ground by the grinding wheel through its entire thickness.

After trimming the edge of the first wafer, the exposed portion of the first wafer is removed to form a transferred layer on the second wafer or substrate. Thinning may be carried out by grinding most of the first wafer, and may further include wet or dry chemical etching of any remaining portion.

By trimming the first wafer before thinning it, and under the operating conditions defined above, it is possible to obtain a complete trim of the first wafer while limiting the penetration depth of the grinding wheel into the first wafer to a depth of less than the total height of the portion of the first wafer to be trimmed (the descent of the grinding wheel is stopped in the first wafer above the bonding interface). The aforementioned peel-off problems are thus avoided.

Examples of particular embodiments of the present invention are described below in reference to the drawings and flow chart. Such examples are not intended to limit the scope of the present invention, and other variations and combinations of the embodiments, which would be recognized by persons of ordinary skill in the art, are intended to be encompassed by the present invention.

One non-limiting example of a trimming process will now be described in relation to FIGS. 1A to 1E and FIG. 2.

FIGS. 1A to 1E and FIG. 2 shows a preferred embodiment of the process for fabricating an SOS heterostructure from a first wafer or initial substrate 110 (top) and a second wafer or support substrate 120 (bottom). The first wafer 110 comprises, at its periphery, a top chamfer 117a and a bottom chamfer 117b, wherein a chamfer may be a rounded or straight bevelled edge. Likewise, the second wafer 120 comprises, at its periphery, a top chamfer 127a and a bottom chamfer 127b. The first wafer 110 has a thickness of between about 600 and 900 µm.

As shown in FIG. 1A, the first wafer 110 consists of an SOI structure comprising a silicon layer 111 on a support 113 also made of silicon, a buried oxide layer 112, for example made of $SiO_2$, being placed between the layer 111 and the support 113. The exterior surface of the first wafer 110 has furthermore been previously covered with a thermal-oxide layer 114 having a thickness of between 10 and 50 nm, formed for example by oxidation of the surface of the wafer, so as to protect the latter during the subsequent chemical etching step. The first wafer 110 may also be a monolithic silicon wafer which may or not further comprise components. In this particular embodiment, the second wafer 120 is a sapphire wafer (FIG. 1A).

The side 111a (covered with oxide layer 114) of the first wafer 110 and the surface 120a of the second wafer 120 are placed in intimate contact and pressure is applied to one of the two wafers so as to initiate the propagation of a bonding wave between the surfaces in contact (step S1, FIG. 1B) to form a direct bond.

Figure 1C:
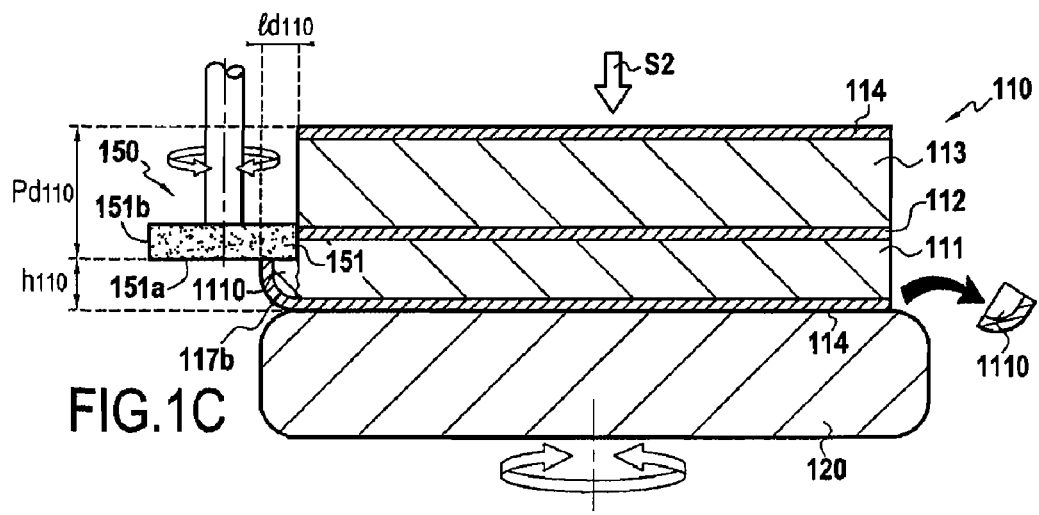
Figure 1D:
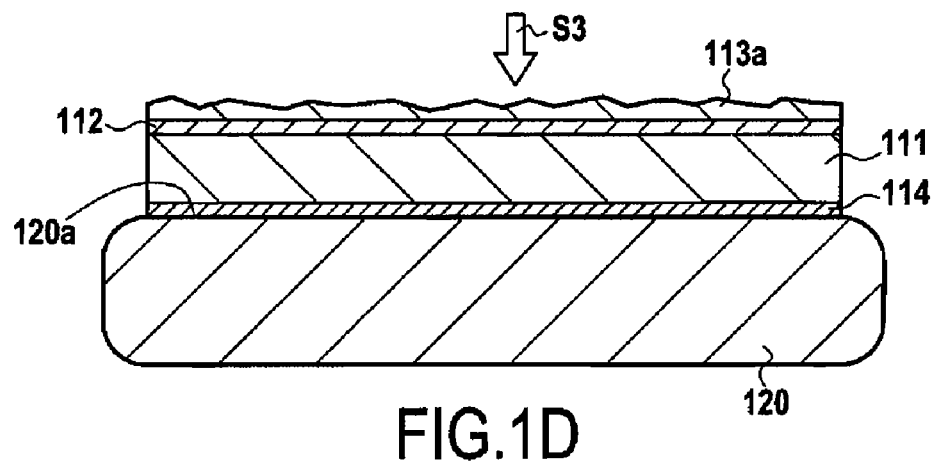
Figure 1E:
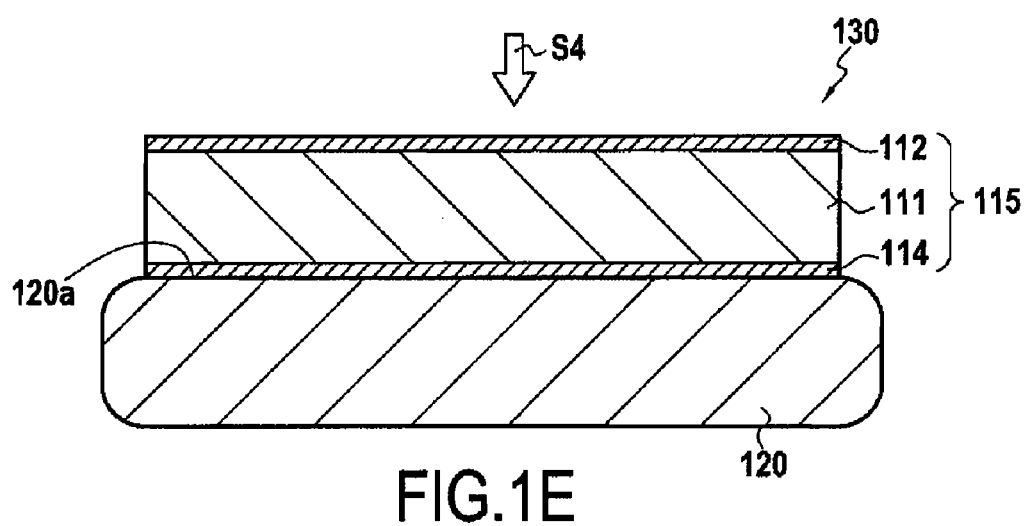

In accordance with the invention, before the thinning of the first wafer 110, the latter is trimmed (step S2, FIG. 1C).

As illustrated in FIG. 1C, a width $ld_{110}$ from the edge of the first wafer 110 is trimmed, this width at least corresponds to the width over which the bottom chamfer 117b of the first wafer extends. For wafers with a diameter of 100 mm, 200 mm and 300 mm, the width $ld_{110}$ trimmed is in general between 2 mm and 10 mm, and preferably between 2 mm and 6 mm.

In the example described here, trimming is carried out by means of a grinding wheel 150 that has a working surface or active part 151, that is to say the surface that comprises grit particles able to grind away the material of the wafer, formed by a first portion 151a parallel to the plane of the wafer and a second portion 151b corresponding to the flank of the grinding wheel 150. In accordance with the invention, the working surface 151 of the grinding wheel 150 comprises grit particles, such as diamond particles, with an average size of less than or equal to 18 microns (or greater than or equal to 800 mesh).

During trimming, the first wafer 110 is trimmed to a (targeted) descent depth $Pd_{110}$ of the grinding wheel 150, defined with respect to a height $h_{110}$ defined relative to a reference plane corresponding to the bonding interface (here the plane of contact between thermal oxide layer 114 and the bonding side 120a of the second wafer 120). The depth $Pd_{110}$ is chosen so that the grinding wheel only penetrates part of the thickness of the first wafer. In the example described here the trimming depth $Pd_{110}$ is chosen so as to stop the descent of the grinding wheel 150 at a height from the bonding interface $h_{110}$ of between 30 µm and 10 µm. The material below this height, which is the annular portion or ring 1110 remaining beneath the grinding wheel 150, lifts off under thermo-mechanical effects. Complete trimming of the first wafer 110 is thus obtained.

The fabrication of the heterostructure then continues with thinning of the first wafer 110 so as to form a transferred layer corresponding to a portion of the trimmed first layer. Thinning is carried out first by grinding most of the support 113 of the first wafer 110 (step S3, FIG. 1D). The grinding is carried out by keeping the working surface of a grinding wheel against the exposed side of the first wafer 110 (not shown in FIG. 1D). During the grinding, the two-wafer assembly is held on the backside of the second wafer 120 by a holder (not shown in FIG. 1D), also called a chuck, comprising a platen able to hold the second wafer 120, for example by suction or by an electrostatic system. During the grinding, the chuck may be stationary whilst the grinding wheel is rotated. Alternatively, the chuck may also rotate about an axis, the grinding wheel may or may not be rotated.

The grinding is stopped about 65 µm from the surface 120a of the sapphire support substrate and bonding interface.

At this stage of the thinning, which is to say before the chemical thinning step, the remaining part 113a of the support 113 of the first wafer 110 has a work-hardened surface (FIG. 1C).

Thinning of the first wafer 110 continues with chemical etching, also called wet etching, of the remaining portion 113a (step S4, FIG. 1E), for example by means of a TMAH (tetramethylammonium hydroxide) or KOH etching solution, or by dry etching such as RIE (reactive ion etching).

In addition to removing the remaining portion 113a of the first wafer, the chemical etching has the effect of removing any fragments of the annular portion 1110 that might have been left behind after the lift-off of that portion.

After etching, an SOS multilayer structure 130 is thus obtained, comprising a sapphire support formed by the second wafer 120 and a transferred layer 115 corresponding at least to the silicon layer 111 of the first wafer 110—the oxide layer 112 may be preserved or removed, for example by HF deoxidation, as required.

Another embodiment of the process involves fabricating a three-dimensional structure by transfer of a layer of microcomponents formed in a first wafer or an initial substrate 200 onto a second wafer or support (bottom) substrate 300 is described in relation to FIGS. 3A to 3G and FIG. 4.

The fabrication of the three-dimensional structure starts with the formation of a first series of microcomponents 204 on the surface of the first wafer 200, the peripheral edge of which has a top chamfer 206a and a bottom chamfer 206b (FIG. 3A, step S1). In the example described here, the first wafer 200 is an SOI multilayer structure, that is to say it comprises a silicon layer 201 placed on a substrate 203 also made of silicon, a buried oxide (BOX) layer 202 (for example a layer of $SiO_2$) being present between the layer 201 and the substrate 203. The first wafer 200 has a thickness of between about 600 and 900 µm.

The microcomponents 204 are formed by photolithography, by means of a mask (not shown) for defining the regions where the patterns corresponding to the microcomponents to be fabricated will be formed. The first wafer then comprises one or more micro-components formed on one face of the wafer.

As shown in FIG. 3A, the external surface of the first wafer 200 is then covered with a thermal-oxide layer 205, having a thickness of between 0.1 and 3 µm for example, and formed for example by oxidation of the surface of the wafer, so as to protect the latter during the subsequent chemical etching step (step S2). The first wafer 200 may also be made of a monolithic silicon wafer.

The second wafer or support substrate 300 is a silicon wafer, the peripheral edge of which has a top chamfer 306a and a bottom chamfer 306b. The external surface of the wafer 300 is covered with a thermal-oxide layer 305 having a thickness of between 0.1 and 3 µm for example (FIG. 3B, step S3).

The side of the first wafer 200 having the microcomponents 204 is then placed in intimate contact with a side of the second wafer 300 via thermal-oxide layers 205 and 305, and pressure is applied to one of the two wafers so as to initiate the propagation of a bonding wave between the surfaces in contact (step S4, FIG. 3C).

Adhesion between the two wafers is improved by a thermal heat treatment that is carried out at a temperature suitable to avoid damage to the components and/or the first wafer. More precisely, after bringing the wafers into contact at room temperature, a bond-strengthening anneal may be carried out at a temperature below 450° C., above which temperature certain metals such as aluminium or copper start to melt. Such an anneal only allows stabilization of the bond to the extent that the bonding energy does not exceed 1 $J/m^2$.

In accordance with the invention, after the bonding and before the thinning of the first wafer 200, the latter is trimmed (step S5, FIG. 3D).

In the example described here, trimming is carried out by means of a grinding wheel 400 that has a working surface or active part 401, that is to say the surface that comprises grit particles able to grind away the material of the wafer, formed by a first portion 401a parallel to the plane of the wafer and a second portion 401b corresponding to the flank of the grinding wheel 400. As shown in FIG. 3E, the portion 401b here is perpendicular to the portion 401a so as to form a flank 200c, trimmed in the first wafer, which is substantially perpendicular to the plane of the first wafer. In accordance with the invention, the working surface 401 of the grinding wheel 400 comprises grit particles, such as diamond particles, with an average size of less than or equal to 18 microns (or greater than or equal to 800 mesh).

As illustrated in FIG. 3D, trimming is carried out over a minimum width $Id_{200}$ from the edge of the first wafer 110 that at least corresponds to the width over which the bottom chamfer 206b of the first wafer extends. For wafers of 100 mm, 200 mm and 300 mm diameter, the width $Id_{200}$ of the trim is in general between 2 mm and 10 mm, more preferably between 2 mm and 8 mm, and most preferably between 2 mm and 6 mm.

During trimming, the first wafer 110 is trimmed to a (targeted) descent depth $Pd_{200}$ of the grinding wheel 400, defined with respect to a height $h_{200}$ defined relative to a reference plane corresponding to the bonding interface (here the plane of contact between thermal oxide layers 205 and 305). The depth $Pd_{200}$ is chosen so that the grinding wheel only penetrates part of the thickness of the first wafer. In the example described here the trimming depth $Pd_{200}$ is chosen so as to stop the descent of the grinding wheel 40 at a height from the bonding interface $h_{200}$ of between 30 µm and 15 µm, which is a height at which the annular portion or ring 210 remaining beneath the grinding wheel 400 lifts off under thermo-mechanical effects. Complete trimming of the first wafer 200 is thus obtained.

Fabrication of the three-dimensional structure continues by carrying out the first thinning step of the first wafer 200, namely the grinding of some of this wafer present above the layer of microcomponents 204 (step S6, FIG. 3E), here most of the substrate 203a. The grinding is carried out under the same conditions as described above.

The grinding is stopped about 65 μm from the surface 300a of the second wafer 300.

At this stage of the thinning, which is to say before the wet or dry chemical etching comprising the second thinning step, the remaining part 203a of the support 203 of the first wafer 200 has a work-hardened surface (FIG. 3E).

Thinning of the first wafer 200 continues by chemical etching of the remaining portion 203a (step S7, FIG. 3F), for example by means of a TMAH (tetramethylammonium hydroxide) or KOH etching solution, or even by dry etching such as reactive ion etching (RIE). The remaining oxide layer may then also be removed by suitable etching.

Once the oxide layer 202 has been removed, a second layer of microcomponents 214 is formed on the exposed surface of the layer 201 (FIG. 3G, step S8). In the example described here, the microcomponents 214 are formed in alignment with the buried microcomponents 204, since a photolithography mask similar to that used to form the microcomponents 204 is used.

A composite structure 500 is then obtained from the second wafer 300 and a transferred layer 215, corresponding to the remaining part of the first wafer 200, comprising the microcomponents 204 and 214.

In a variant on the previous embodiment, the three-dimensional structure is formed by a multilayer stack, that is to say by bonding one or more additional wafers or substrates onto the layer 201, each additional wafer being in alignment with the directly adjacent layer or layers. A partial trimming, carried out between the two thinning steps in accordance with the invention as described hereinabove, is performed for each wafer so as to form a transferred layer. Furthermore, before each transfer of an additional wafer, it is possible to deposit, on the exposed layer, an oxide layer, for example a layer of TEOS, so as to make assembly easier and to protect the trimmed regions (in which the material of the underlying wafer is exposed) from subsequent chemical etching.

According to one particular embodiment, one of the layers of microcomponents may especially comprise image sensors.

According to another embodiment, components have been previously formed in the supporting second wafer before its assembly with the first wafer that makes up the transferred layer.

It is to be understood that some or all of the above described features and steps can be combined in different ways, and other variations and modifications will be apparent to those of ordinary skill in the art. It is intended that all of these embodiments, examples, variations and modifications thereon are meant to be encompassed within the spirit and scope of the present invention as set forth in the following claims.

What is claimed is:

1. A process for fabricating a multilayer structure that comprises:
    bonding a first wafer having a chamfered edge onto a second wafer at a bonding interface in a manner that provides the bonding interface with an adhesion energy of less than or equal to 1 J/m$^2$;
    completely trimming the edge of the first wafer using a grinding wheel, wherein the descent of the grinding wheel into the first wafer continues to a distance from the bonding interface that is less than 30 μm and the trimming includes lifting off the remaining portion of the edge of the first wafer by thermo-mechanical effect created by the grinding wheel; and
    thinning the first wafer after trimming the edge, so as to form a transferred layer.

2. The process of claim 1, wherein the working surface of the grinding wheel comprises grit particles having an average size of greater than or equal to 800 mesh or less than or equal to 18 microns, and the trimming is carried out by lowering the grinding wheel at a rate of descent of greater than or equal to 5 microns per second.

3. The process of claim 1, wherein the edge of the first wafer is trimmed by a width that is at least equal to the width over which the chamfered edge extends.

4. The process of claim 3, wherein the trimming step is carried out over the edge of the first wafer by a width of between 2 mm and 8 mm.

5. The process of claim 1, wherein the first wafer has a thickness of at least 600 μm before thinning.

6. The process of claim 1, wherein the thinning includes grinding the first wafer after trimming the edge.

7. The process of claim 6, which further comprises a chemical etch step carried out after the thinning step.

8. The process of claim 1, wherein before bonding the first wafer to the second wafer, an oxide layer is formed on exposed surfaces of the first wafer.

9. The process of claim 8, which further comprises fabricating at least one layer of micro-electronic or opto-electronic components on one side of the first wafer before the bonding step, and wherein the side of the first wafer having the layer of components is the side bonded onto the second wafer.

10. The process of claim 9, which further comprises fabricating a second layer of micro-electronic or opto-electronic components on the side of the first wafer opposite the side having the first layer of components after forming the transferred layer.

11. The process of claim 10, wherein at least the first layer of components comprises image sensors.

12. The process of claim 1, which further comprises providing the first wafer with micro-electronic or opto-electronic components.

13. The process of claim 1, which further comprises, after forming the transferred layer, providing micro-electronic or opto-electronic components in the transferred layer.

14. The process of claim 1, wherein, before the bonding step, an oxide layer is formed on exposed surfaces of the first wafer.

15. The process of claim 14, wherein, before the bonding step, an oxide layer is formed on exposed surfaces of the second wafer.

16. The process of claim 1, wherein the first wafer is a silicon wafer or an SOI structure, optionally containing micro-electronic or opto-electronic components, and the second wafer comprises sapphire or silicon.

17. The process of claim 1, wherein the first wafer is an SOI structure comprising a support, an oxide layer on the support and a silicon layer on the oxide layer with the SOI having exterior surfaces that include a thermal-oxide layer having a thickness of 10 to 50 nm.

18. The process of claim 17, wherein the second wafer is a silicon wafer having exterior surfaces that include a thermal-oxide layer having a thickness of 10 to 50 nm.

19. The process of claim 18, which further comprises fabricating at least one layer of micro-electronic or opto-electronic components on the thermal-oxide layer of one side of the first wafer before the bonding step, and wherein the side of the first wafer having the layer of components is the side bonded onto the second wafer.

20. The process of claim 19, which further comprises fabricating a second layer of micro-electronic or opto-electronic on the side of the first wafer opposite the side having the first layer of components after forming the transferred layer.

* * * * *